US005481212A

United States Patent [19]
Shima

[11] Patent Number: 5,481,212
[45] Date of Patent: Jan. 2, 1996

[54] SAMPLE-AND-HOLD CIRCUIT DEVICE

[75] Inventor: Takeshi Shima, Kanagawa, Japan

[73] Assignee: Kabushiki Kaisha Toshiba, Kawasaki, Japan

[21] Appl. No.: 208,812

[22] Filed: Mar. 11, 1994

[30] Foreign Application Priority Data

Mar. 12, 1993 [JP] Japan .................................. 5-052039

[51] Int. Cl.$^6$ ................................................. G11C 27/02
[52] U.S. Cl. ............................................. 327/94; 327/91
[58] Field of Search ................................ 327/91, 93, 94, 327/95, 96, 97, 50, 58

[56] References Cited

U.S. PATENT DOCUMENTS

| | | | |
|---|---|---|---|
| 3,852,619 | 12/1974 | Carbrey | 327/94 |
| 4,352,070 | 9/1982 | Beauducel et al. | 327/95 |
| 4,363,976 | 12/1982 | Minor | 327/94 |
| 5,162,670 | 11/1992 | Itakura et al. | |
| 5,304,866 | 4/1994 | Uranaka | 327/94 |

OTHER PUBLICATIONS

IEEE International Solid–State Circuits Conference, pp. 44–45, Feb. 25, 1987, M. Armstrong, et al., "A CMOS Programmable Self–Calibrating 13b Eight–Channel Analog Interface Processor".

European Solid State Circuit Conference, pp. 169–172, Sep. 1991, T. Itakura, et al., "Low Output–Offset Variation S/H Circuits For An LCD Segment Driver IC Achieving Wide Signal Frequency Bandwidth".

Symposium on ULSI Circuit, pp. 117–118, May 1993, G. M. Haller, et al., "A 700–MHZ Switched Capacitor Analog Waveform Sampling Circuit".

*Primary Examiner*—Toan Tran
*Attorney, Agent, or Firm*—Oblon, Spivak, McClelland, Maier & Neustadt

[57] ABSTRACT

A sample-and-hold circuit device capable of realizing a high-precision and high-speed operation, in which the output signal is independent of the error signal caused by a MOS transistor. The circuit includes a first switch coupled between an input terminal and a first internal terminal, a second switch coupled between the first internal terminal and a second internal terminal, a capacitor coupled between the second internal terminal and a reference potential, a buffer for transferring a potential held in the capacitor to an output terminal, a control signal generator for controlling the first switch to turn off after the second switch is turned off, and then to again turn on the second switch so as to replace an error charge into the second switch.

22 Claims, 13 Drawing Sheets

| $t = t_3 - \delta$ | $t_3 + \delta \leq t \leq t_7 - \delta$ | $t = t_7 + \delta$ |
|---|---|---|
| $V_{N1} = V_{IN}$ | $V_{N1} = V_{IN} + V_{ERROR}$ | $V_{N1} = V_{IN}$ |
| $V_{N2} = V_{IN}$ | $V_{N2} = V_{IN} + V'_{ERROR}$ | $V_{N2} = V_{IN}$ |
| $\phi 2$ = HIGH | $\phi 2$ = LOW | $\phi 2$ = HIGH |

SAMPLE-AND-HOLD CIRCUIT DEVICE

BACKGROUND OF THE INVENTION

1. Field of the Invention

The present invention relates to a high-speed and high-precision sample-and-hold circuit device comprising a MOS analog switch.

2. Description of the Invention

According to a conventional sample-and-hold circuit device, a MOS analog switch samples an input analog signal and a voltage of the input analog signal is held in a capacitor. When the MOS analog switch is set in a closed state, the input analog signal is sampled and charge is accumulated in a capacitor until a terminal potential of the capacitor reaches an input terminal potential. Then, the MOS analog switch is set in an open state, the input terminal is separated from the terminal of the capacitor, and the charges accumulated in the capacitor are held.

In the conventional sample-and-hold circuit device, when the MOS analog switch is operated at high speed, i.e. the frequency for switching the MOS analog switch is increased, it is difficult for the conventional sample-and-hold circuit to perform an ideal sample-and-hold operation. The reason for this will be described below.

Stray capacitance called overlap capacitances are present between a gate electrode and a drain electrode and between the gate electrode and a source of each MOS transistor. When the MOS switch is changed from the closed state to the open state by a control signal supplied to the gate electrode, the control signal leaks from the gate electrode into the capacitor through the overlap capacitor. The leaking signals represent an error charge and are superposed on the charges held in the capacitor.

In addition, according to an operational principle of a MOS transistor, channel changes are generated in the channel of the MOS transistor during the ON state. When the MOS transistor switches to an OFF state at a very low speed, the channel charge flows in the one of the source and drain electrodes which has a lower impedance. In contrast to this, if the MOS transistor goes to an OFF state at a high speed, the channel charge branches and flows in both the source and drain electrodes. Therefore, if the sampling rate is increased, a given percentage of channel charge is superposed, as error charge, on the charges held in the capacitor.

In using an MOS transistor as a sampling switch for the conventional sample-and-hold circuit, a p-channel MOS transistor and an n-channel MOS transistor are connected in parallel with each other i.e, a CMOS transistor switch,.so as to reduce the variation of the CMOS transistor's resistance corresponding to voltage of the input signal. The channel charges of the p-channel MOS transistor and those of the n-channel MOS transistor have electrical characteristics opposite to each other, so the CMOS transistor switch decreases the amount of error changes caused by the two kinds of channel charges.

However, the amount of channel charge relative to the voltage of the input signal is different among the respective transistors. Moreover the amount of the channel charge of the p-channel MOS transistor is not equal to the charge of the n-channel MOS transistors, and the error charge of each transistor is not compensated exactly in the way described above. The amount of error charge which is not compensated completely and remains as channel charge is dependent on input voltage, which is called the non-linear characteristic error, so this characteristic causes a non-linear error of the output voltage relative to the input voltage.

In another way to cancel error charges, error-cancelling p-channel MOS and n-channel MOS transistors are connected in parallel to a terminal of sampling p-channel MOS transistor and sampling n-channel MOS transistor to construct CMOS transistor as a sampling switch. The error-cancelling transistors are set to ON and OFF states complimentarily to the CMOS transistor. Then the error charges of the sampling p-channel MOS transistor and the sampling n-channel MOS transistor flows into the error-cancelling p-channel transistor and the error-cancelling n-channel transistor, because when those sampling transistors are set in the OFF state, these error-cancelling transistors are set in the ON state. As a result, ideally, the error charges are not held in the capacitor.

However, in practice, the two transistors for switching are not set in ON state at the same time. It is quite difficult to synchronize the switching transistors during the ON state. Then, the error charge of one sampling transistor which is set in the OFF state earlier flows in the side of the input terminal through the other sampling transistor which is still set in the ON state, and the error charge is not cancelled completely.

As described above, in the conventional technique, the error charge caused by the stray capacitance of the MOS transistor and by the channel charge in the channel of the MOS transistor can not be cancelled perfectly. So the voltage held in the capacitor is different from the voltage of the input signal.

SUMMARY OF THE INVENTION

It is an object of the present invention to provide a sample-and-hold circuit device which cancels error and variation of output voltage.

In accordance with the present invention there is provided a sample-and-hold circuit device comprising an input terminal for receiving an input signal; first switch means, responsive to a first control signal, for selectively coupling the input terminal and a first internal node; second switch means, responsive to a second control signal, for selectively coupling the first internal node and the second internal node; first potential holding means coupled between the second internal node and a reference potential terminal; and control signal generating means to generate the first and second control signals to close the first and second switch means to sample an input potential of the input signal in the first potential holding means as a holding potential, to generate the second control signal to open the second switch means to hold the holding potential in the first potential holding means, and to generate the first and second control signals to open the first switch means and close the second switch means to condition the holding potential.

In one aspect of the present invention, there is further provided a second potential holding means coupled between the first internal node and the reference potential terminal.

In another aspect of the present invention, there is further provided a device output terminal; third switch means coupled between the second internal node and the device output terminal; buffer means coupled between the second internal node and the third switch means; and the third switch means being responsive to a third control signal generated by the control signal generating means for selectively coupling the buffer means and the device output terminal.

In accordance with another aspect of the present invention, there is further provided means for selectively providing in the second potential holding means a magnitude of charge substantially equal to a charge held in the first potential holding means.

In accordance with an additional aspect of the present invention, there is further provided fourth switch means, responsive to a fourth control signal generated by the control signal generating means, for selectively coupling the first internal node and a buffer output terminal of the buffer means; wherein the buffer means includes a voltage follower circuit including: operational amplifier means having a positive input terminal, a negative input terminal and a buffer output terminal; fifth switch means responsive to a fifth control signal generated by the control signal generating means; sixth switch means responsive to a sixth control signal generated by the control signal generating means; a first source follower circuit having an input coupled to the second input terminal node and an output coupled through the fifth switch means to the positive input terminal; and a second source follower circuit having an input coupled to the buffer output terminal and an output coupled through the sixth switch means to the negative input terminal.

DETAILED DESCRIPTION OF THE PREFERRED EMBODIMENT

Figure 1:
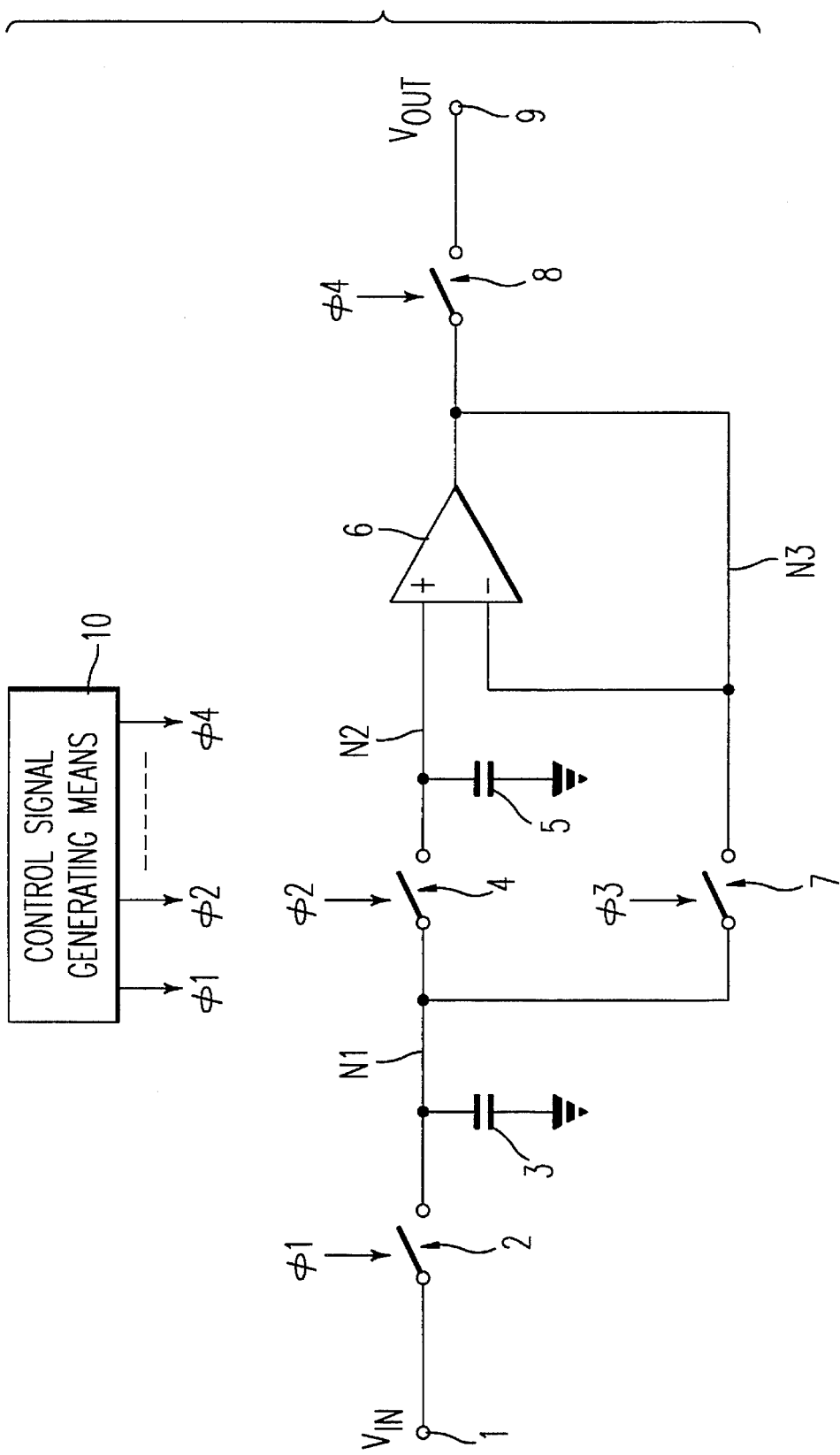
FIG. 1 is a circuit diagram showing a sample-and-hold circuit device according to a first embodiment of the present invention.

A first embodiment of the present invention is described in detail below with reference to FIG. 1.

A sample-and-hold circuit constructed in accordance with the first embodiment includes an input terminal 1 for receiving an input signal voltage Vin. The input terminal 1 is coupled to one terminal of a first switch 2. The other terminal of the first switch 2 is connected to a first internal terminal or node N1 and to one terminal of a first capacitor 3. The other terminal of the first capacitor 3 is connected to a reference potential, in this example, to a ground potential.

The first node N1 is connected to one terminal of a second switch 4 for sampling the input signal voltage. The other terminal of the second switch 4 is connected to a second internal terminal of node N2 and to one terminal of a second capacitor 5, which has equal capacitance to the first capacitor 3. The other terminal of the second capacitor 5 is connected the reference potential, for example the ground potential. A positive internal terminal of an operational amplifier 6 is connected to the internal terminal N2.

A negative internal terminal of the operational amplifier 6 is connected to an output terminal of the operational amplifier 6, to provide a voltage-follower circuit having unity gain, so as to detect a voltage of the node N2, i.e, a voltage between the other terminal of the second switch 4 and the reference potential. The output terminal of the operational amplifier 6 is also connected to a third internal terminal or node N3. The third node N3 is connected to one terminal of a third switch 7, and the other terminal of the third switch 7 is connected to the node N1, and thus to one terminal of the second switch 4. One terminal of a fourth switch 8 is connected to the output terminal of the operational amplifier. The other terminal of the fourth switch 8 is connected to an output terminal 9 to transfer a output signal voltage Vout.

The switches 2, 4, 7, 8 are controlled by control signals $\phi1$, $\phi2$, $\phi3$, $\phi4$, respectively, generated by a control signal generating means 10. Each switch 2, 4, 7, 8 is a CMOS switch, which is constructed by a p-channel MOS transistor Q1 and an n-channel MOS transistor Q2, shown in FIG. 2, connected in parallel with each other. The CMOS switch is in a turned-on condition when the transistor Q1 is controlled by the control signal of a logic "0" and the transistor Q2 is controlled by the control signal of a logic "1". Each control signal $\phi1$, $\phi2$, $\phi3$, $\phi4$ is a combination of a positive and a negative control signal, for example $\phi1'$ and $\phi1$ shown in FIG. 2. For example the two transistors of switch 2, Q1 and Q2, are controlled by the control signals, $\phi1$ and $\phi1'$.

It is not essential that the switches 2, 4, 7, 8 are constructed as CMOS switches, i.e., the combination of a p-channel MOS transistor and a n-channel MOS transistor. Indeed, these switches can be constructed as only a p-channel MOS transistor or an n-channel MOS transistor.

The operation of the sample-and-hold circuit of the first embodiment of the present invention will be explained below, with reference to a timing chart of control signals shown in FIG. 3 and circuit diagrams of respective states in one sampling and holding period, shown in FIGS. 4, 5, 6, 7, 8 and 9. In FIGS. 4, 5, 6, 7, 8 and 9, each of the switches is a CMOS switch including an n-channel MOS transistor, and dotted shading represents a channel charge of the n-channel MOS transistor.

Figure 3:
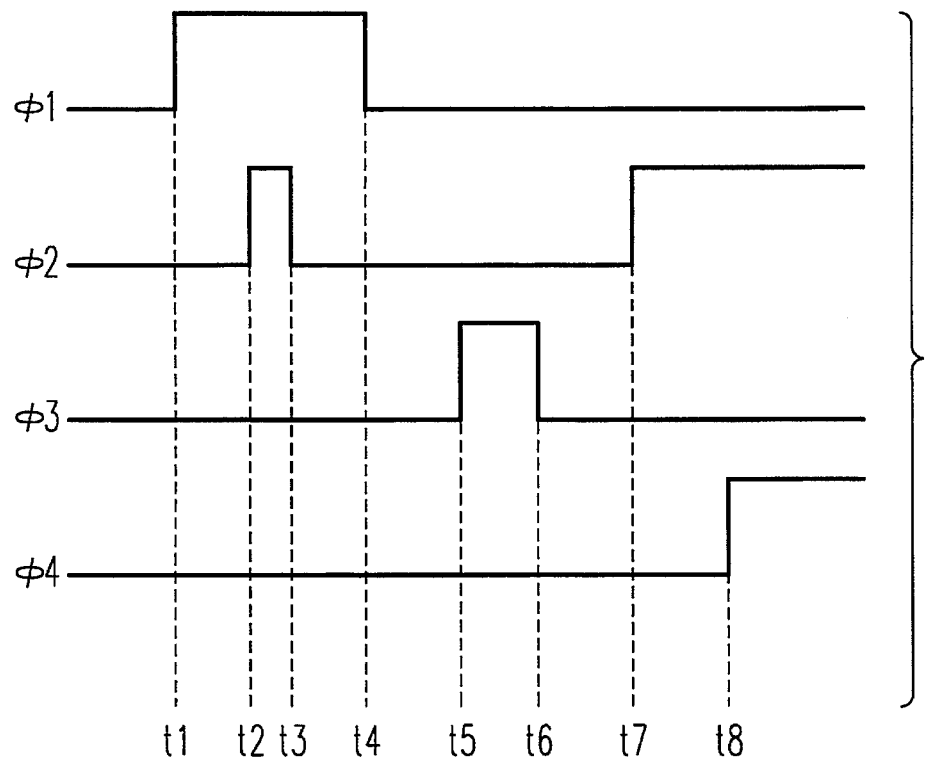
FIG. 3 is a timing chart of control signals to control the switches used for the sample-and-hold circuit device in FIG. 1
Figure 4:
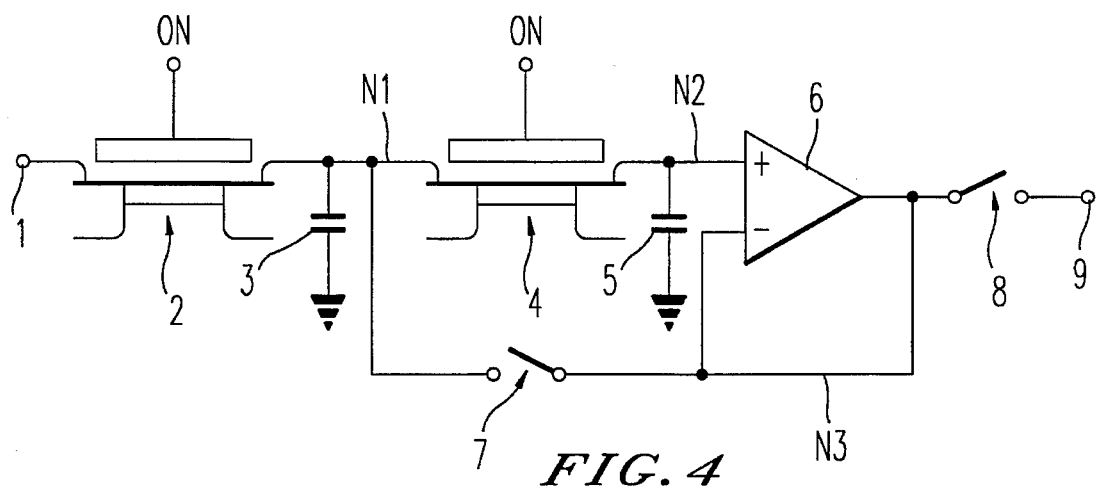
FIGS. 4, 5, 6, 7, 8 and 9 are circuit diagrams for explaining an operation of the sample-and-hold circuit device in FIG. 1.
Figure 5:
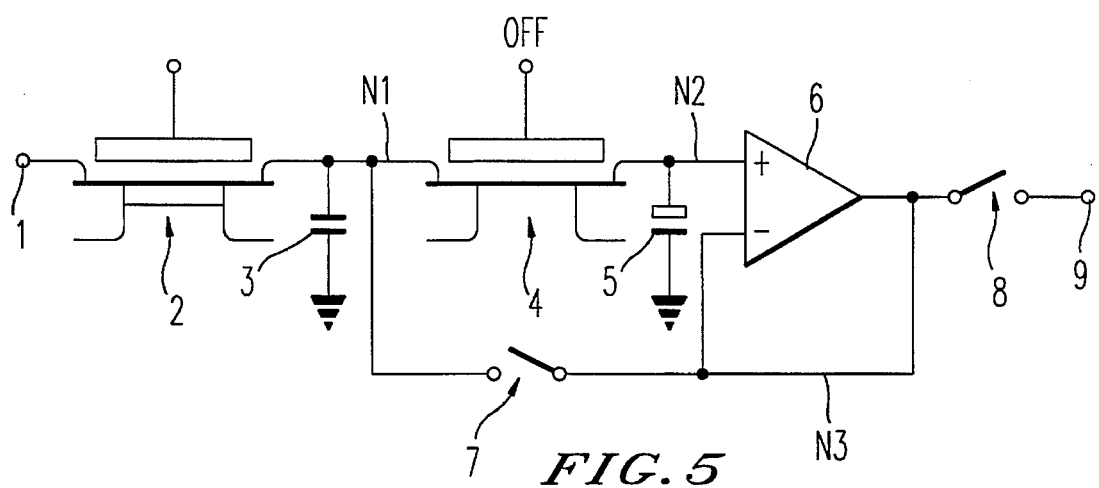

In the beginning of one sampling and holding period, the switch 2 is turned on by the control signal φ1 at the time t1 shown in FIG. 3. During the period of the switch 2 being turned on, at the time t2. The switch 4 is turned on by the control signal φ2 so as to transfer an input signal voltage Vin, supplied to the input terminal 1, to the node N2 through the switches 2 and 4, so that the capacitor 5 is charged by the input signal voltage Vin. As a result, the capacitor 5 is charged equal to the input signal voltage Vin. The switch 4 is turned off by change of state of the control signal φ2 at the time t3. As a result, the node N2 is separated from the node N1, and the signal charge accumulated in the capacitor 5 is held. In,he transition of the switch 4 from an on state to an off state, the channel charge of the MOS transistor 4 and the error charge caused by the overlapped capacitance are added to the signal charge held in the capacitor 5, shown in FIG. 5 by dotted shading on capacitor 5. The error voltage (Verror) due to the added charges is included in the voltage of the node N2 (Vin+Verror) at the time t3.

Figure 6:
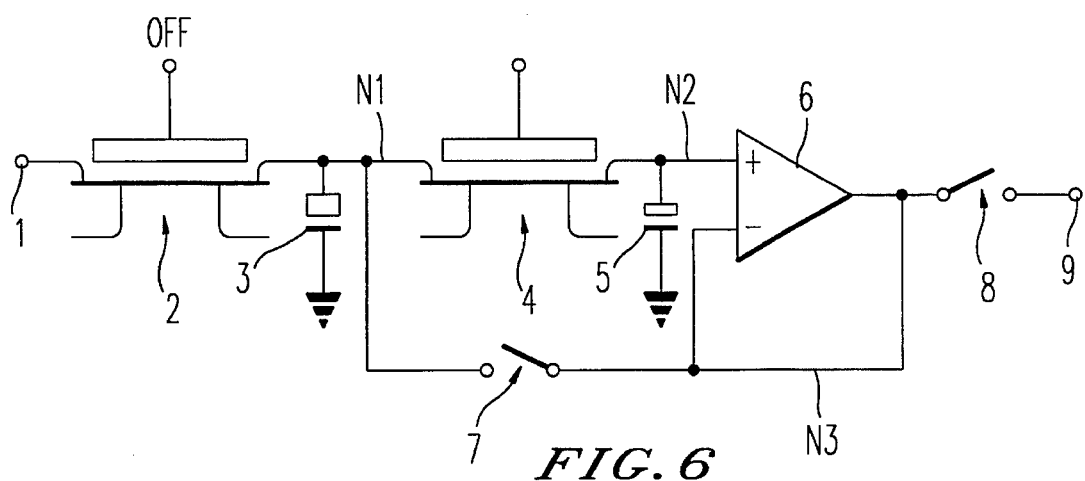

Then, the switch 2 is turned off by the change of state the control signal φ1 at the time t4. As a result, the node N1 is separated from the input terminal 1, and a signal charge caused by an input voltage Vin' at this time is held in the capacitor 3. The voltage Vin' held in the capacitor 3 is different from the voltage Vin held in,the capacitor 5, because of the passage of time from the time t3 to the time t4. In a state change of the switch 2 upon turning off, the channel charge of the MOS transistor 2 is added t0 the signal charge held in the capacitor 3, as shown in FIG. 6, so that the error voltage (Verror') caused by the channel charge is added to the voltage held in the capacitor 3 (Vin').

Figure 7:
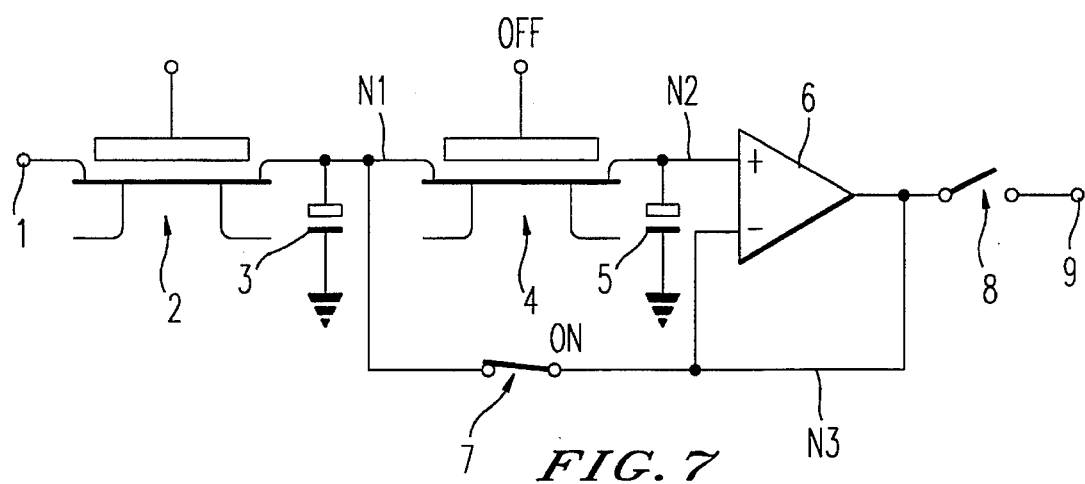

When the switch 7 is turned on by the control signal φ3 at the time t5, while the switch 2 is set in an off state, as shown in FIG. 7, the voltage of the node N3 is made equal to the voltage of the node N2, .i.e., Vin+Verror, because the operational amplifier 6 connected as the voltage follower circuit and the switch 7 will provide to the node N1 the voltage of the node N3, coupled to the output terminal of the operational amplifier 6. As a result, the voltages of source and drain electrodes of MOS transistor 4 also become Vin+Verror.

Figure 8:
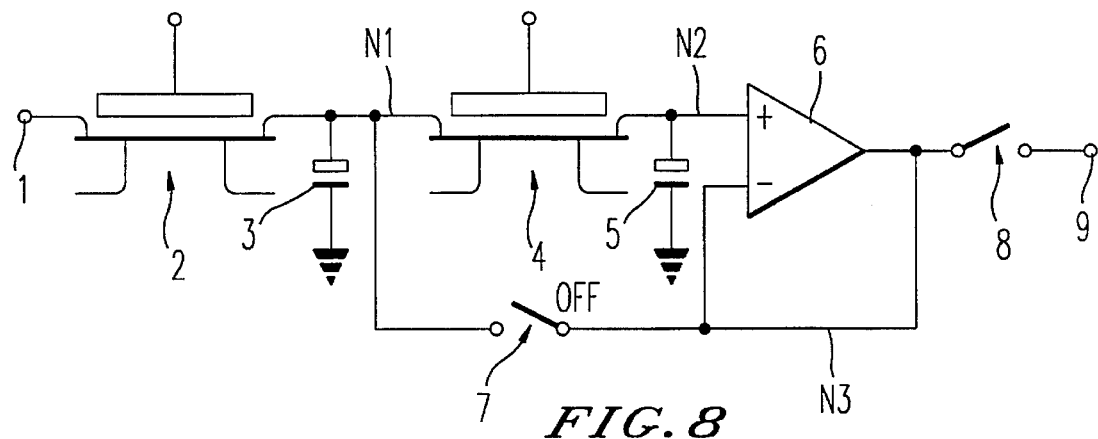

The switch 7 is turned off by the change of state of the control signal φ3, shown in FIG. 8, and the voltage Vin+Verror is maintained at the node N1, on the condition that the size of the MOS transistor constituting the switch 7 is smaller than the size of the MOS transistor 2 or 4, or on the condition that the switch 7 is changed in so long period from the on state to the off state that the channel charge of the MOS transistor 7 and the error charge caused by the overlapped capacitance can be neglected. The error voltage Verror is generated by the channel charge of the MOS transistor 4 at the time t3, in which the voltages of both sides (N1 and N2) of the electrode of the transistor 4 are Vin. Because of the operational amplifier 6 and the switch 7, the voltage of the node N1 is equal to the voltage of the terminal N2, Vin+Verror, just before the time t7.

Figure 9:
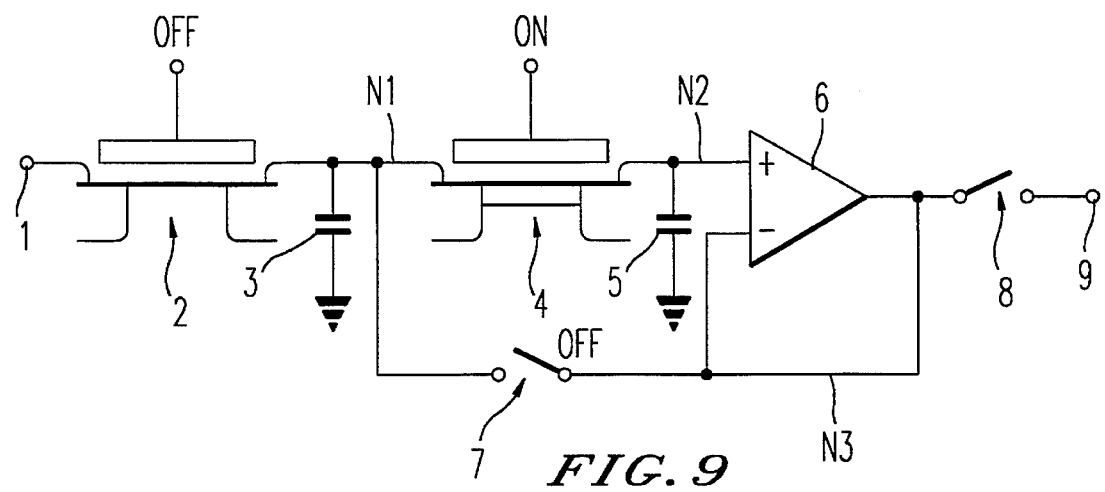

Then, the switch 4 is turned on again at the time t7, shown in FIG. 9. As a result, the channel charge is recovered to the MOS transistor 4 and the error charge generated by the overlapped capacitance is cancelled by the MOS transistor 4 and the voltage of the nodes N1, N2 is equal to the input voltage Vin. Further, when the switch 8 is turned on by the control signal φ4 at the time t8 while keeping the switch 4 turned on by the control signal φ2, the voltage of the node N2 which is just equal to the input voltage Vin is transferred to the output terminal 9. In this manner described above, one series of the sampling and holding period is ended.

In accordance with the first embodiment, the output voltage Vout will not include the error voltage Verror, and the voltage of the output terminal will not be dependent upon the error voltage.

Figures 10, 11:
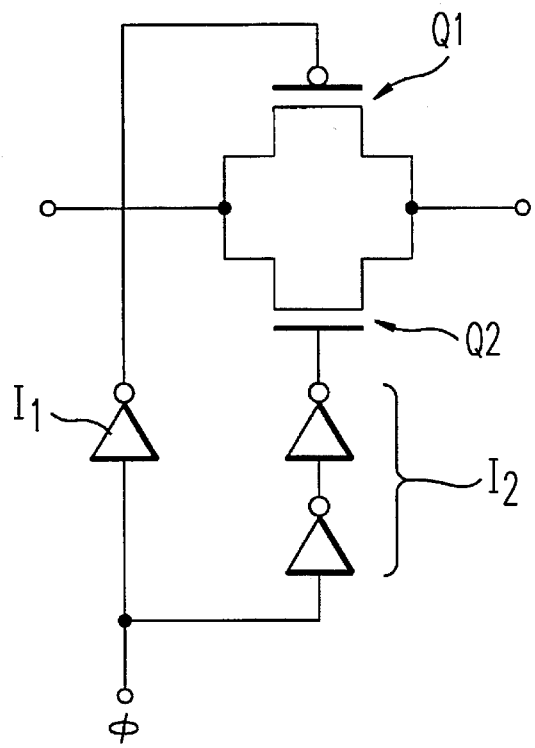
FIG. 10 is a time table showing the voltage of each terminal of the sampling switch used for the sample-and-hold circuit device in FIG. 1.
FIG. 11 is an another circuit diagram of a CMOS transistor switch for use in the sample-and-hold circuit device shown in FIG. 1.

FIG. 10 shows the state of the switch 4 around the time t3 and the time t7. The transition of the voltages of the nodes N1 and N2 from the time t3−δ to the time t3+δ is related contrary to the transition from the time t7−δ to the time t7+δ. Cancelling the error voltage of the switch 4 is based on the characteristic of the transition of the voltage of each terminal and the fact that the flow of the channel charge from the electrode would be reversible. Thus, error compensation is carried out under the principle mentioned above, in the construction of the sample-and-hold circuit with the switches 2, 4 and 7 as CMOS switches.

Figure 2:
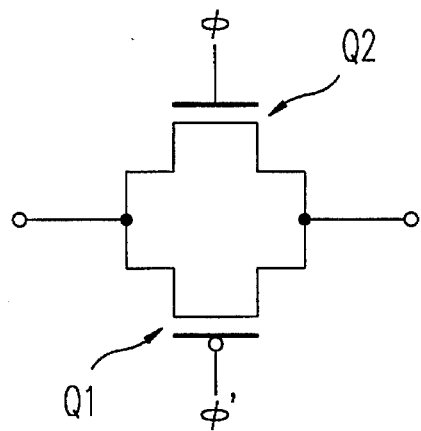
FIG. 2 is a circuit diagram of a CMOS transistor switch of the present invention in FIG. 1.

Instead of the CMOS switch shown in FIG. 2, the switches 2, 4, 7 and 8 can be constructed by the MOS transistors Q1, Q2 and inverter gate circuit shown in FIG. 11, which is controlled by a control signal φ provided through an inverter gate device I1 or two inverter gate devices connected in series I2. The two MOS transistors Q1 and Q2 are turned on or off at the same time, by adjusting the delay times of the device I1 and the devices I2 by regulating the size of the transistor included in the gate device I1 or the gate devices I2. Therefore, the first embodiment of the sample-and-hold circuit device constructed using the CMOS switch is assured to be precise as well as another embodiment of the sample-and-hold circuit device constructed using a single-channel MOS switch, that is to say an n-channel MOS switch or a p-channel MOS switch.

Figure 12:
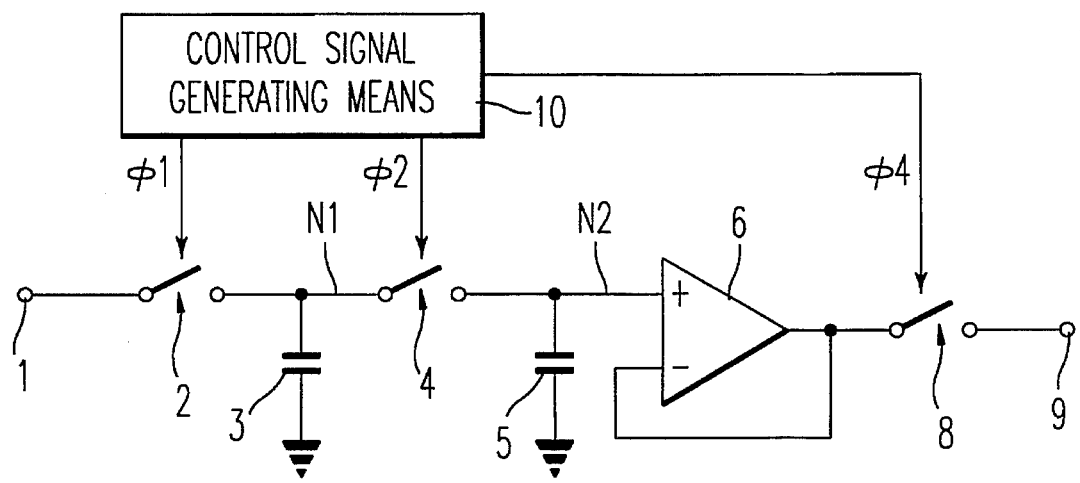
FIG. 12 is a circuit diagram showing a sample-and-hold circuit device according to a second embodiment of the present invention.

FIG. 12 shows a second embodiment of the sampling-and-holding circuit device of the present invention. In FIG. 12, the sample-and-hold circuit comprises the capacitor 3 which has a larger capacitance than the capacitor 5. For example, the capacitor 3 has twice the capacitance of the capacitor 5. In the second embodiment, the circuit does not include the connection through the switch 7 between node N1 and the negative internal terminal of operational amplifier 6.

Figure 13:
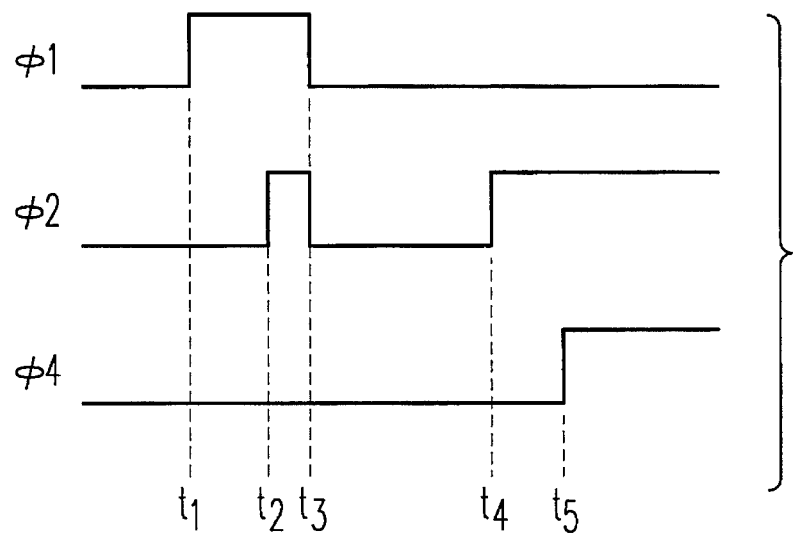
FIG. 13 is timing chart of control signals used for the sample-and-hold circuit device in FIG. 12.

According to the time chart shown in FIG. 13, the sampling-and-holding circuit of the second embodiment is controlled with the same timing as explained in FIG. 3 until the time t3. At the time t3, as the control signal φ2 and the control signal φ1 are changed to a low voltage, the switch 4 is turned off to separate the node N2 from the node N1, the charge accumulated in the capacitor 5 is preserved, and the switch 2 is turned off at the same time. The error charge caused by half of the channel charge of the switch 4 flows into each capacitor 3 and 5, and the error charge caused by the channel charge of the switch 2 is added to the signal charge of the capacitor 3.

Referring to "Measurement and Analysis of Charge Injection in MOS Analog Switches" (JE-HURN SHIEH, MAHESH PATIL,BING J.SHEU, IEEE JOURNAL OF SOLID-STATE CIRCUITS, VOL.SC-22, No. 2, APRIL 1987 P277–P281), it is assumed that half of the channel charge of the switch 2 is accumulated in the capacitor 3 as the error charge, so that the total of error charge held in the capacitor 3 is nearly twice the error charge held in the capacitor 5. Since the capacitance of the capacitor 3 is approximately twice the capacitance of the capacitor 5, the error voltage, which is generated between the electrodes of the capacitor 3 by the error charges flowing from the switch 2 and 4 at the time t3, is equal to the voltage generated between the electrodes of the capacitor 5 by the error charge flowing from the switch 4. At the time t3, the voltages of the input terminal and the output terminal of the switch 4 are also Vin+Verror.

While the switch 2 is turned off, the switch 4 is turned on again by the control signal φ2 at the time t4. As a result, the error charge generating the error voltage Verror will return to the switch 4 as the channel charge, and the remaining error charge caused by the switch 2 is shared by the capacitor 3 and the capacitor 5 in accordance of the capacitance ratio.

While the control signal φ2 keeps the switch 4 turned on after time t4, the control signal φ4 controls the switch 8 to turn on at the time t5. As a result, the voltage of the node N2 is transferred to the output terminal, so the error voltage of the switch 4 is removed from the output voltage.

Compared with the first embodiment, the sampling and holding period of the second embodiment is shorter, and there are fewer steps of the sampling and holding. This is because the sampling and holding period of the second embodiment is constructed without the step that the output voltage of the operational amplifier 6 is transferred to one terminal of the switch 4 by the control signal φ4, as explained for the first embodiment.

In the second embodiment, ideally the switches 2 and 4 should be controlled to be turned off at the same time t3. However, in case the switches 2 and 4 are turned off at the same time, the sampling-and-holding circuit described in the second embodiment will cancel the error voltage of the switch 4 on the condition that the operation speed of the MOS transistors comprised in the switch 2 or 4 is faster than the speed of changing of the analog input signal.

In the case that the operating speed of the switch 2 or 4 is much faster than the changing speed of the analog input signal, an alternate construction of the sample-and-hold circuit device of the second embodiment can be provided. In the alternate construction, the capacitance of the capacitor 3 is nearly equal to the capacitance of the capacitor 5, and the switch 2 is controlled to be turned off after the switch 4 is turned off at time t3. When the switch 4 is turned off at time t3, the signal charge accumulated in the capacitor 5 is stored in the capacitor 5, the error charge caused by half of the channel charge of the switch 4 is also stored in the capacitor 5, and the other half of the channel charge flows to the input terminal through the switch 2 which remains set in an on state. Then, when the switch 2 is turned off, nearly half of the channel charge of the switch 2 flows into the capacitor 3. When the switch 2 and 4 are constructed to have the same size, the charge held in the capacitor 3 is almost equal to the charge held in the capacitor 5, because the capacitors 3 and 5 have the same capacitance.

The switch 4 is turned on again while the switch 2 turned off, so that the error charge held in the capacitors 3 and 5 is absorbed as the channel charge of the MOS transistor of switch 4, and the signal charges held in the capacitors 3 and 5 are shared between those capacitors. Then, while the switch 4 remains on and the switch 8 is turned on, the voltage of the node N2 is transferred to the output voltage 9.

In this alternate construction of the second embodiment, the capacitance of the capacitor 3 is designed equal to the capacitance of the capacitor 5, and the capacitance of the capacitor 3 is approximately one-half the capacitance of the capacitor 3 in the first embodiment. As a result, this construction the sample and-hold circuit is smaller than that of the first embodiment.

Figure 14:
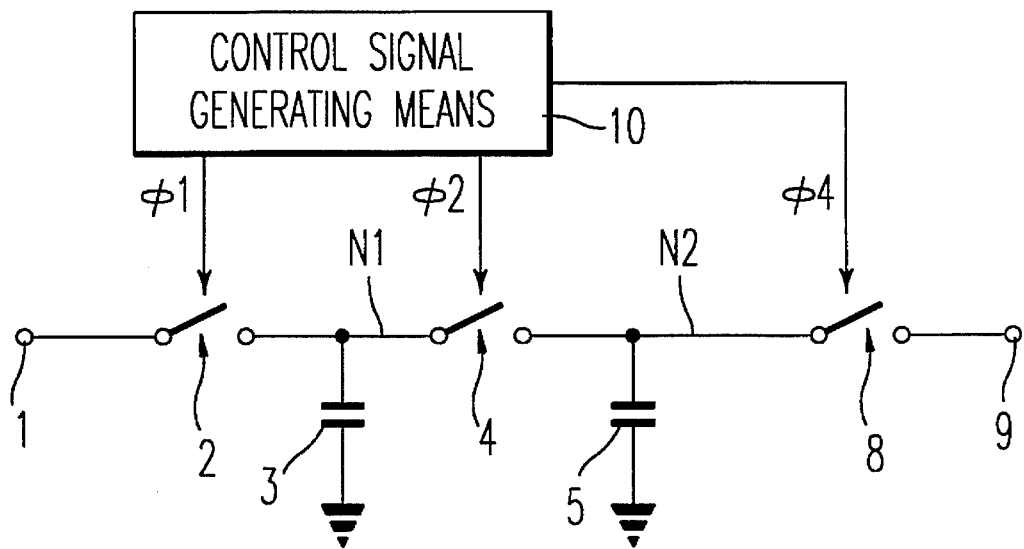
FIG. 14 is a circuit diagram showing a sample-and-hold circuit device according to a third embodiment of the present invention.

FIG. 14 shows a third embodiment of the present invention. In FIG. 14, the input terminal 1 is connected to one terminal of the sampling switch 2, the other terminal of which is connected to one terminal of the capacitor 3 and to one terminal of the sampling switch 4. The other terminal of the switch 4 is connected to one terminal of the capacitor 5, which is one-half the capacitance of the capacitor 3, and to one terminal of the switch 8. The other terminal of the switch 8 is connected to the output terminal 9.

The control signal generating means 10 provides control signals φ1, φ2 and φ4 to the switch 2, 4 and 8, respectively. The control signals φ1, φ2, and φ4 are provided in accordance with the time chart shown in FIG. 13 in the manner described above in the second embodiment. While the switch 2 is turned on by the control signal φ1, the switch 4 is turned on by the control signal φ2 and the signal charge is accumulated in the capacitor 3 or 5. Then, the switches 2 and 4 are turned off at the same time, and the channel charge of the MOS transistor 2 or 4 flows into the capacitor 3 or 5. Before the switch 8 is turned on, the channel charge held in the capacitor 3 or 5 is returned to the channel of the MOS transistor 4.

In the third embodiment, the constitution of the circuit device shown in FIG. 14 is less complex than that shown in FIG. 12. The sampling and holding period is shorter than that of the first embodiment shown in FIG. 1, because the sample-and-hold circuit shown in FIG. 14 is operated without the operation of the operational amplifier. In particular, the sample-and-hold circuit comprises sufficient structure to sample and hold the input voltage.

As also explained in the second embodiment, in an alternate construction set of the third embodiment, the capacitance of the capacitor 3 is set equal to the capacitance of capacitor 5 and the switch 4 is turned off by the control signal φ2 before the switch 2 is turned off by the control signal φ1.

Figure 15:
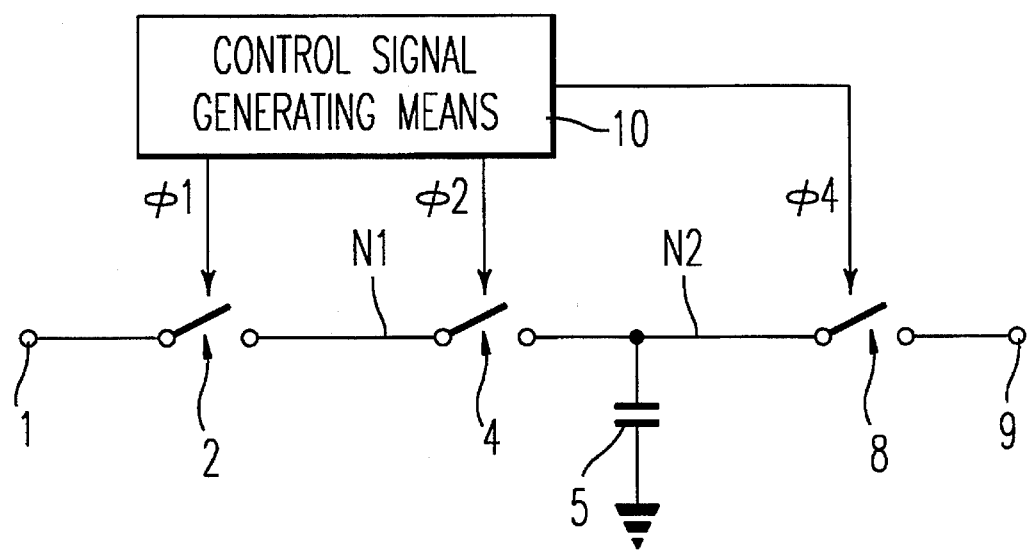
FIG. 15 is a circuit diagram showing a sample-and-hold circuit device according to a fourth embodiment of the present invention.

FIG. 15 shows a fourth embodiment of the sample-and-hold circuit device. In this embodiment, the input terminal 1 is connected to one terminal of the switch 2, and the other terminal of the switch 2 is connected to one terminal of the switch 4. The other terminal of the switch 4 is connected to the capacitor 5 and to one terminal of the switch 8. The other terminal of the switch 8 is connected to the output terminal 9. In this embodiment, the capacitor is not included.

The control signal generating means 10 controls the switches 2, 4 and 8 by the control signal φ1, φ2 and φ4. In this embodiment, as a sampling mode, both the switch 2 and the switch 4 are turned on by the control signals φ1 and φ2. Then the switch 4 is turned off while the switch 2 is turned on. As a holding mode, both the switches 2 and 4 are turned off under condition that the switch 4 is opened before the time when the switch 2 is opened or both switches 2 and 4 are opened at the same time. As a transferring mode, the switch 4 is turned on by the control signal φ2 before the switch 8 is turned on, to remove the error charge stored in the capacitor 5. When the change of the input signals is very little in the interval between the time when the switch 4 is turned off in the holding mode and the time when the switch 4 is turned on again in the transferring mode, the construction of this embodiment operates without sacrificing the held data accuracy.

Figure 16:
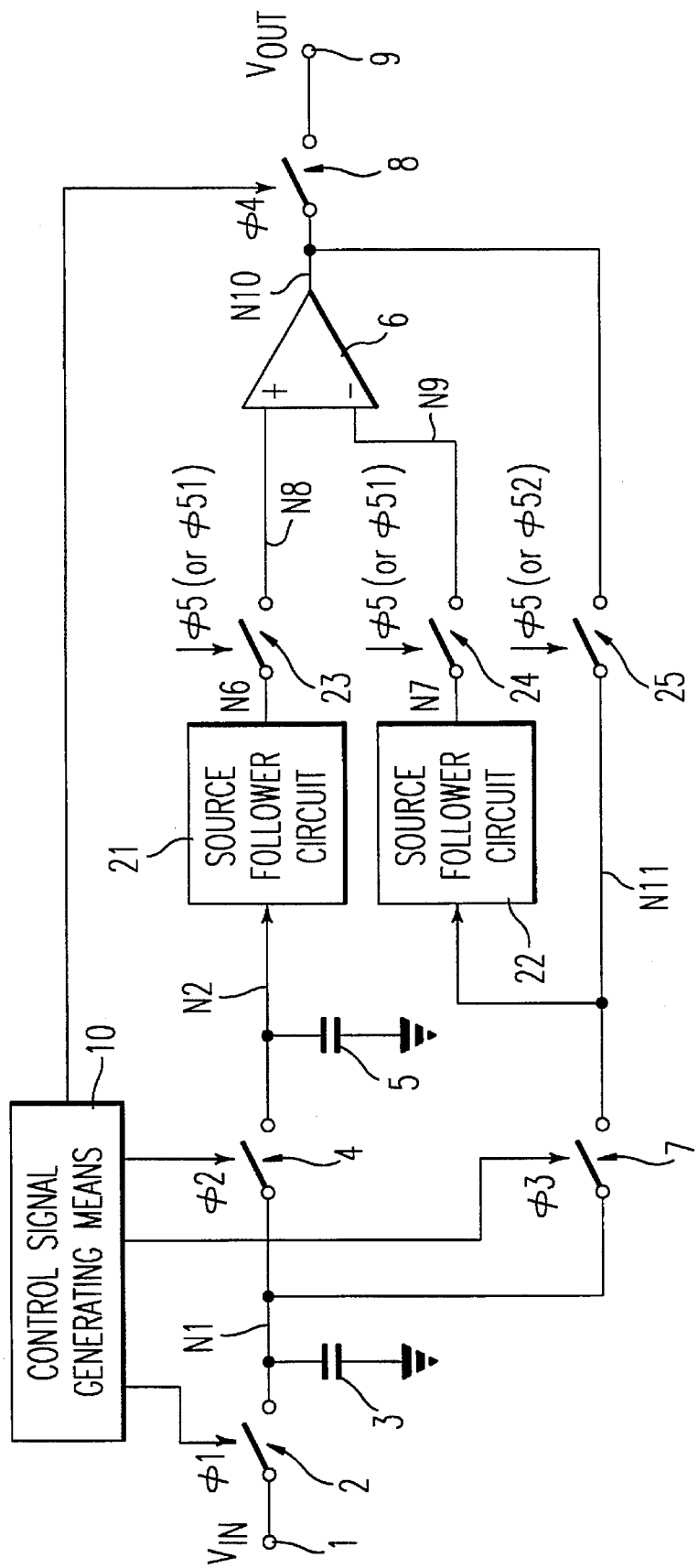
FIG. 16 is a circuit diagram showing a sample-and-hold circuit device according to a fifth embodiment of the present invention.

FIG. 16 shows the fifth embodiment of the sample-and-hold circuit device, which further comprises source follower circuits 21, 22 and switches 23, 24 respectively connected to the positive and the negative input terminals of the operational amplifier 6, and a switch 25 between the output terminal of the operational amplifier 6 and the switch 7.

Figure 17:
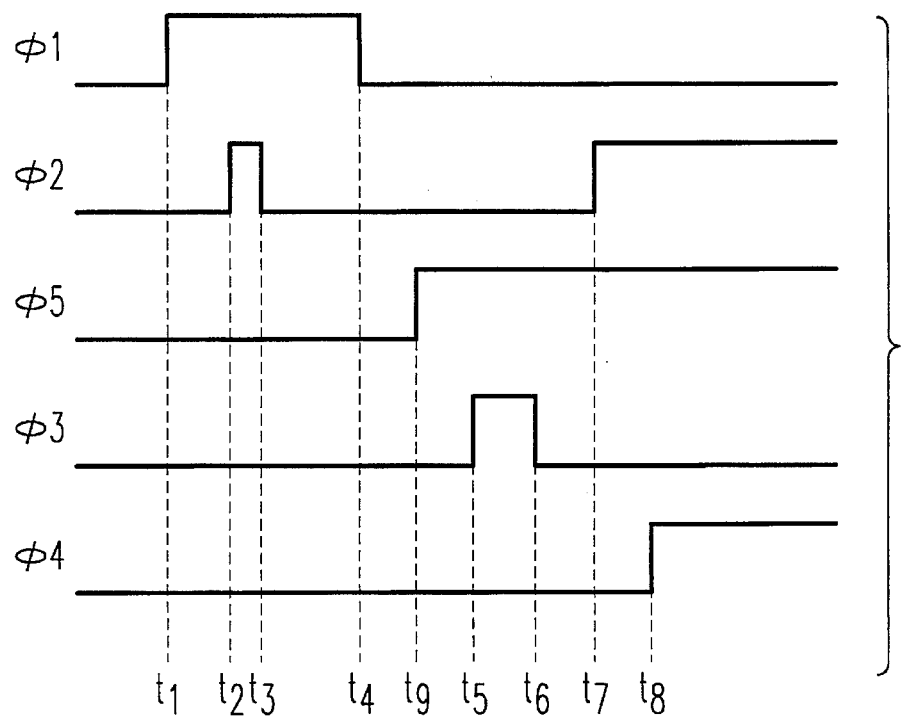
FIG. 17 is timing chart of control signals used for the sample-and-hold circuit device in FIG. 16.

Referring to the time chart shown in FIG. 17, operation of this embodiment is explained. The switches 2, 4, 7 and 8 are controlled by the control signals φ1, φ2, φ3 and φ4 respectively provided by the control signal generating means, and the switches 23, 24 and 25 are controlled by the control signal φ5. Each switch 2, 4, 7, 8, 23, 24 and 25 is comprised by a CMOS switch which is constituted by connecting a p-channel MOS transistor and an n-channel MOS transistor in parallel or either type single-channel MOS transistor. At the time t1, the switch 2 is turned on, and between the time t2 and t3, the signal charge is accumulated in the capacitor 5 by turning on the switch 4. Then, the switches 23, 24 and 25 are turned on by the control signal φ5, so that the operational amplifier 6 is connected to the source follower circuits 21, 22.

In general, there are a few micro-seconds until an operational amplifier is stabilized to a linear amplifying state, and an input impedance or an input capacitance of the operational amplifier varies according to the operational state of the operational amplifier. The combined capacitance of the capacitor 5 and the input capacitance of the operational amplifier varies between the starting state and the stabilizing state of the operational amplifier, because the input capacitance is changing during this time.

In this embodiment, the operational amplifier 6 is separated from the source follower circuits 21 and 22 by means of the switches 23, 24 and 25 being turned off until the time t9. In this case, the switching speed of the source follower circuit 21, 22 is faster than the stabilizing speed of the operational amplifier 6, and the switching speed of the source follower circuit does not effect the input capacitance of the operational amplifier.

Figure 18:
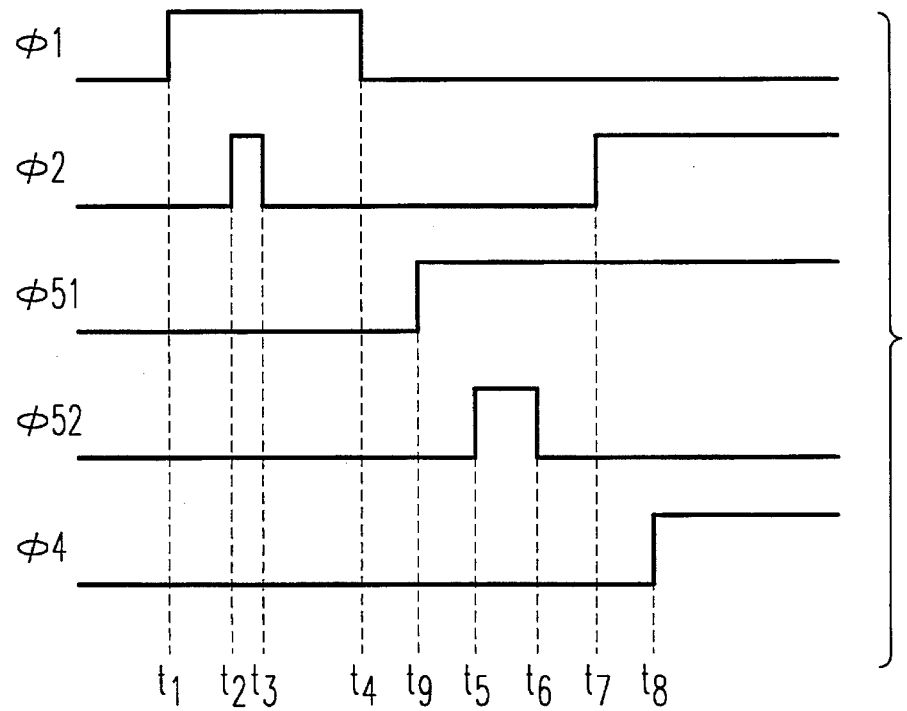
FIG. 18 is a timing chart of another set of control signals for use in the sample-ant-hold circuit device shown in FIG. 16.

In accordance with the control signals of a time chart shown in FIG. 18, an alternative operation of the fifth embodiment of the sample-and-hold circuit is possible. The control signal φ3 is controlled to always be "1", which is the high of logic state, so that the switch 7 is closed continuously. The switches 23, 24 are controlled by the control signal φ51, and the switch 25 is controlled by the control signal φ52. The control signals φ1, φ2 and φ4 are controlled in the same manner as described above with respect to FIG. 17.

In the fifth embodiment, the capacitance of the node N1 or N2 is determined by the following equations:

(the capacitance of the node $N1$) =

(the capacitance of the capacitor 3) +

(the input impedance of the source follower circuit 22).

(the capacitance of the node $N2$) =

(the capacitance of the capacitor 5) +

(the input impedance of the source follower circuit 21)

Each capacitances of the capacitor 3 and 5 are designed to be equal to each other and each MOS transistor comprising the source follower circuits 22 and 21 is designed to be the same size. As a result, the capacitance of the node N1 is made to be equal to the capacitance of the node N2. In this way, the sample-and-hold circuit is less dependent on the error charge of the switch 4 than the circuit shown in FIG. 1.

Figure 19:
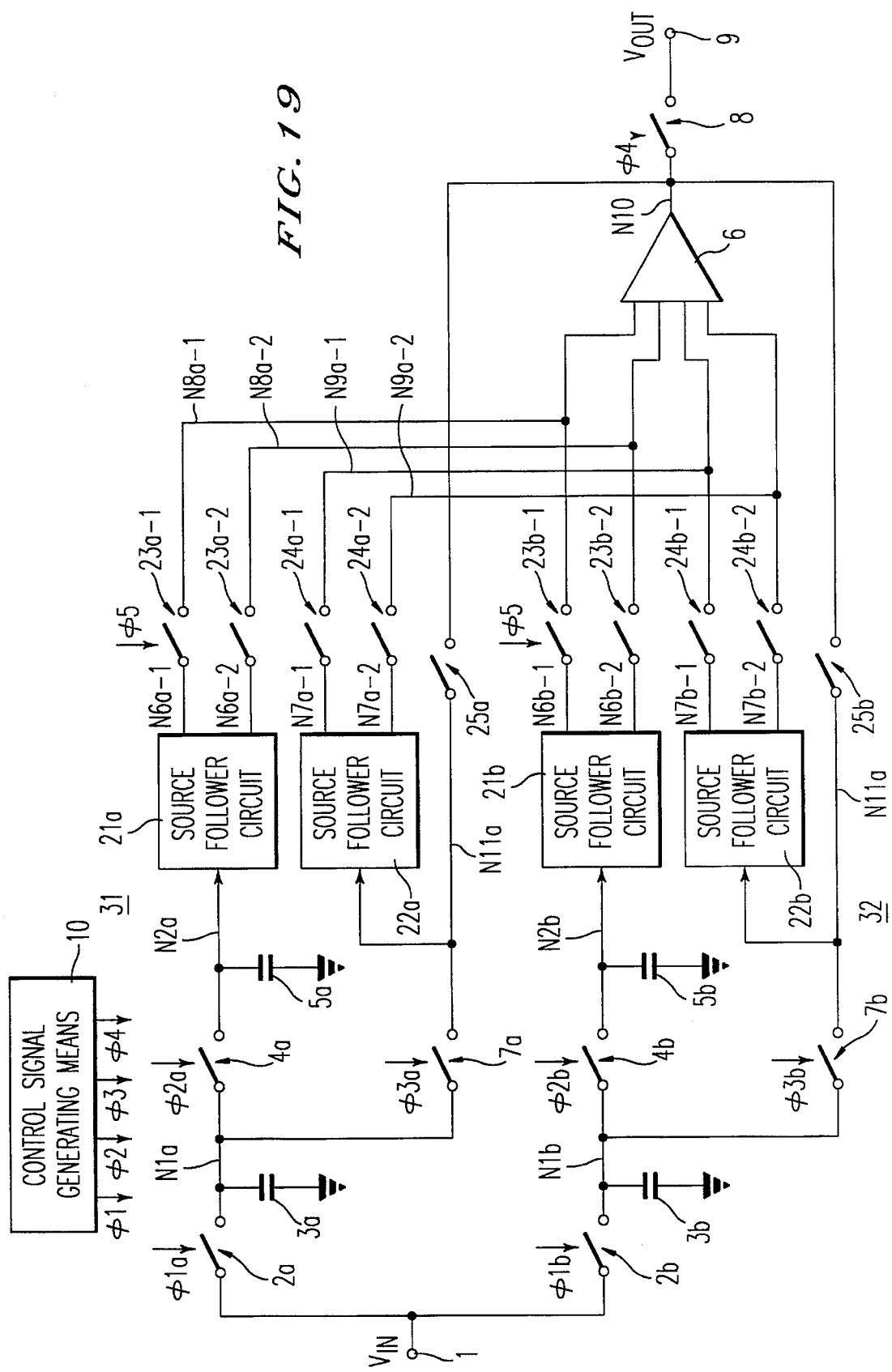
FIG. 19 is a circuit diagram showing a sample-and-hold circuit device according to a sixth embodiment of the present invention.

Shown in FIG. 19, the sample-and-hold circuit device of the fifth embodiment is constructed in another manner. A control signal φ3a or φ3b controlling the switches 7a, 25a or 7b, 25b is maintained normally "1", which is the "high" logic level. The switch 1a or 1b is controlled by a control signal φ1a or φ1b, the switch 4a or 4b is controlled by a control signal φ2a or φ2b, the switch 8 is controlled by a control signal φ4, and the switches 23a-1, 23a-2, 23b-1, 23b-2, 24a-1, 24a-2, 24b-1 or 24b-2 are controlled by a control signal φ5 in the same way of controlling shown in FIG. 17. In this case, the switches 7a and 7b are always turned on, and the capacitance of the node N1 or N2, while the switches 2a, 2b, 4a and 4b are open, is described in the following equations:

(the capacitance of the node $N1a$ or $N1b$) =

(the capacitance of the capacitor 3a or 3b) +

(the input impedance of the source follower circuit 22a or 22b)

(the capacitance of the node $N2a$ or $N2b$) =

(the capacitance of the capacitor 5a or 5b) +

(the input impedance of the source follower circuit 21a or 21b)

Then each capacitance of the capacitors 3a, 3b and 5a, 5b is designed to be equal to each other and each MOS transistor comprising the source follower circuits 22a, 22b and 21a, 22b is designed to be the same size, so that the capacitance of the nodes N1a, N1b is made to be equal to the capacitance of the nodes N2a, N2b. In the way mentioned above, the error signal caused by the switch 4a or 4b is further reduced in comparison to the circuit shown in FIG. 1.

Figure 20:
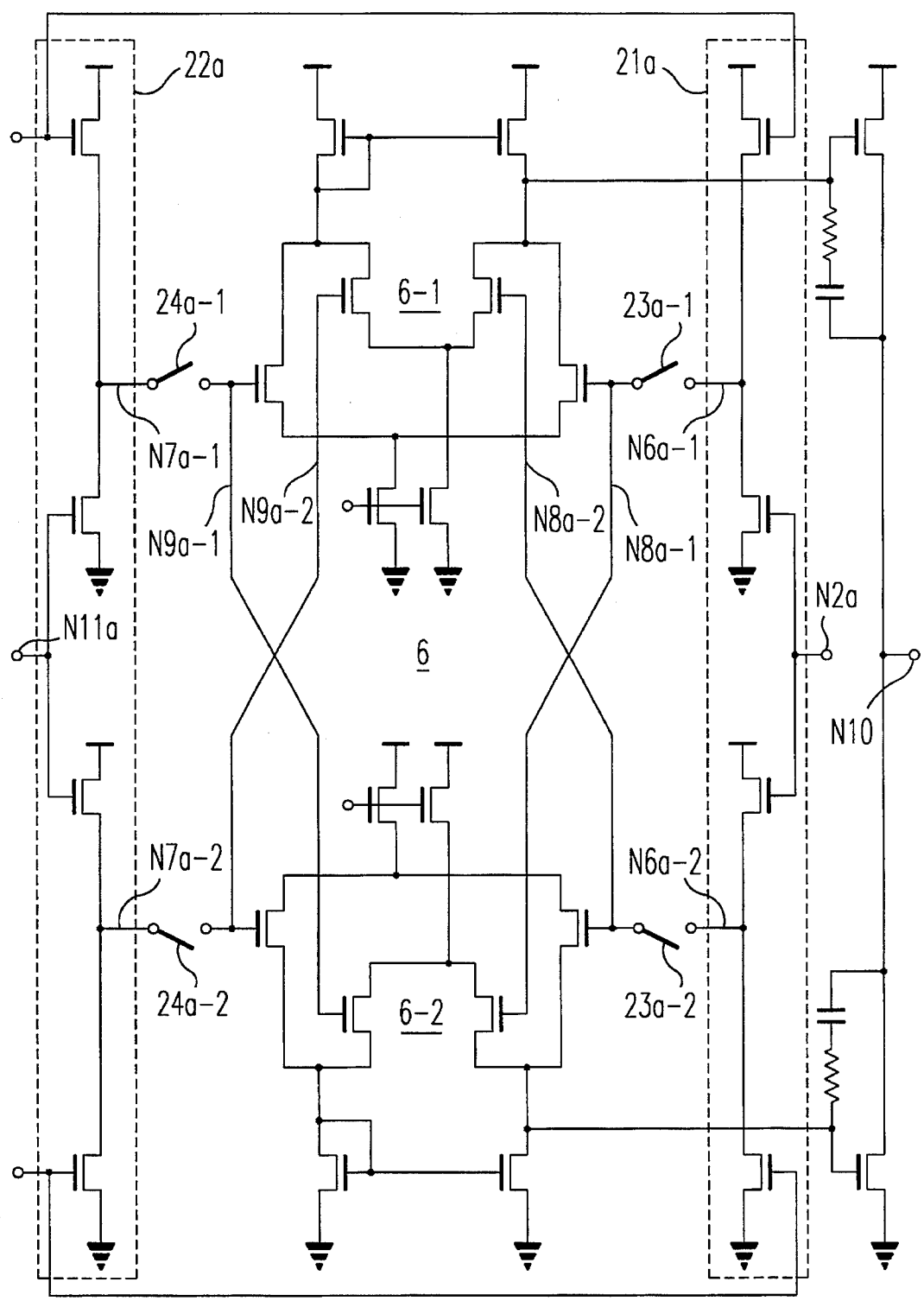
FIG. 20 is a circuit diagram showing a portion of the sample-and-hold circuit device according to the sixth embodiment in detail.

In FIG. 20, an embodiment of progressive type of sample-and-hold circuit is drawn. This embodiment is applied for a LCD (liquid crystal display) panel device in which data lines and address lines are disposed in a cross-sectional manner. A TFT (thin film transistor) and liquid crystal cell are arranged at the crossing area of the address line and the data line is driven by input video signals.

For data line driving circuits of the LCD panel device, groups of sample-and-hold circuit device are used to hold the input video signal for every horizontal scanning period and drive the liquid crystal cell through the TFT. When the data line driving circuit is constructed by an IC (Integrated Circuit) which integrates a lot of sample-and-hold circuit devices, variation of the error signals held in the respective sample-and-hold circuit decreases the precision of the video signal. Also, when the data line driving circuit consists of only one stage of sample-and-hold circuit devices, the video signal is made worse by external noises because the TFT is driven in only one horizontal blanking period of a horizontal scanning period. When the data line driving circuit is constituted by two stages of sample-and-hold circuit devices to reduce the external noises, the amplitude of the output signal of the sample-and-hold circuit decreases and the variation of the error signal is much broader. In addition, for reasons of the difference of characteristics between ICs, color or brightness of one strip-like screen area driven by one IC is different from that driven by another IC. Since the error signal is not included in the output signal of the sample-and-hold circuit of the present invention, the data line driving circuit having the two stages of sample-and-hold circuit devices does not cause the variation of the error signal.

Shown in FIG. 19, a first stage of sample-and-hold circuit 31 or a second stage of sample-and-hold circuit 32 are constructed in the same way shown in FIG. 16, and one of these circuits is set to be in a sampling state while the other is set to be in a holding state mutually. An operational amplifier 6 is operated for adjusting the voltage of the node N1*a* of the sample-and-hold circuit 31 and the voltage in the node N1*b* of the sample-and-hold circuit 32, and is used as the voltage follower circuit which transfers the holding signal of the sample-and-hold circuit in the holding state to the output terminal 9.

This embodiment is used for reducing the error signal and is much smaller than the circuit which is arranged in a parallel connection of the two sample-and-hold circuits because one operational amplifier is used for both sample-and-hold circuits. In particular, this construction is advantageous for the LCD panel display driving IC since the LCD panel needs a lot of sample-and-hold circuits.

In FIG. 20, a suitable construction of the source follower circuits and the operational amplifiers are shown in detail. The source follower comprises a source follower circuit including p-channel MOS transistors and a source follower circuit including n-channel MOS transistors, FIG. 20 shows the source follower circuits 21*a*, 22*a* included in the first sample-and-hold circuit 31 in FIG. 19, in particular. The output signals of the source follower 2*a*, 22*a*, 21*b*, 22*b* made by p-channel MOS transistors are provided to differential pairs of transistors 6-1, 6-2 foiled by n-channel MOS transistors and p-channel MOS transistors of the operational amplifier 6 by way of the switches 23*a*-1, 24*a*-1, 23*b*-1, 24*b*-1. The output signals of the source follower circuits 21*a*, 22*a*, 21*b*, 22*b* made by n-channel MOS transistor are provided to differential pairs of transistors 6-1, 6-2 of the operational amplifier 6 by way of the switches 23*a*-2, 24*a*-2, 23*b*-2, 24*b*-2.

In this construction, when an input voltage of the source follower is close to the supply voltage, the source follower formed by p-channel MOS transistors in source follower circuits 21*a*, 22*a*, 21*b*, 22*b* does not work, so the differential pair of transistors 6-2 does not work, but the source follower made by n-channel MOS transistors does work, so the differential pair of transistors 6-1 does work. Therefore, even if the input voltage of the source follower circuit varies from ground potential to the supply voltage, the sample-and-hold circuit described above can be operated.

Figure 21:
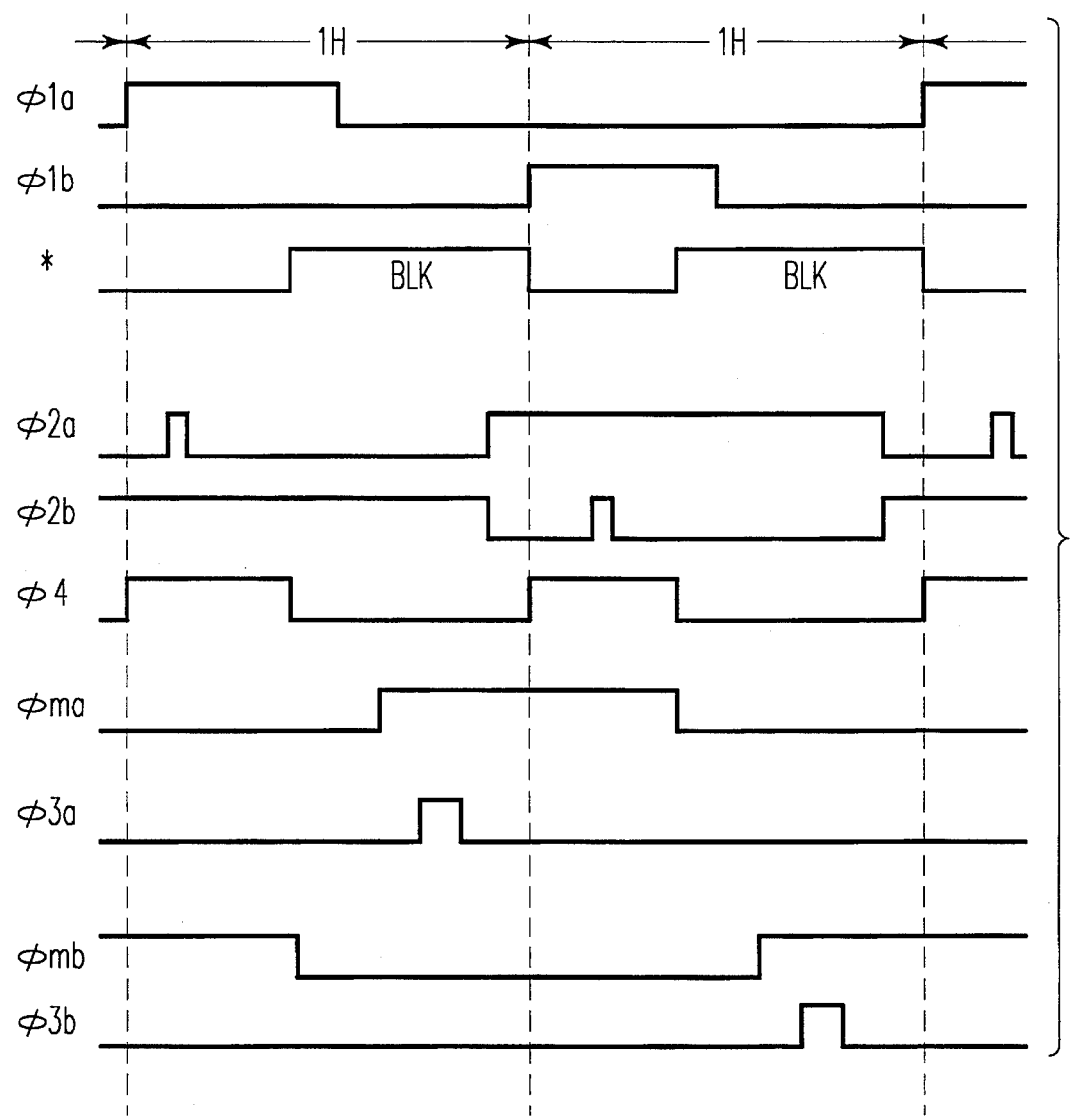
FIG. 21 is timing chart of control signals used for the sample-and-hold circuit device in FIG. 18.

FIG. 21 shows the time chart of control signals of this embodiment. φ1*a*, φ1*b* are the control signals of the switches 2*a*, 2*b*, φ2*a*, φ2*b* are the control signals of the switches 4*a*, 4*b*, φ4 is the control signal of switch 8, φma is the control signal of the switches 23*a*-1, 23*a*-2, 24*a*-1, 24*a*-2, φmb is the control signal of the switches 23*b*-1, 23*b*-2, 24*b*-1 and 24*b*-2. Also in FIG. 21, "*" shows a period of one horizontal scanning (1H) and a period of blanking (BLK) of a video signal as the input signal.

As described above in detail, the present invention will provide a high precision and high speed operation sample-and-hold circuit device without error signals caused by MOS transistors. Further, the sample-and-hold circuit of the present invention can be applied for a data line driving circuit used in the LCD panel devices.

In accordance with the description above, a first aspect of the present invention, there is provided a sample-and-hold circuit device using a MOS analog switch which comprises an input terminal for receiving an input signal, a first switch means for sampling the input signal, a first potential holding means connected between the first switch means and a constant potential terminal to hold a holding potential of the input signal, a second switch means connected between the input terminal and the first switch means to break the input signal, and a third switch means to provide the holding potential to an output terminal.

As a second aspect of the present invention, there is provided the sample-and-hold circuit device described above which further comprises a control means to turn the first switch means on and to turn the second switch means off when the third switch means is turned on to provide the holding potential to the output terminal.

As a third aspect of the present invention, there is provided a sample-and-hold circuit device using a MOS transistor as an analog switch which compensates for a non-linear characteristic error caused by a sampling switch when the sampling switch is changed from an on state to an off state, by way of switching the sampling switch on again during the same sampling period in order to return the channel charge of the sampling switch to itself.

As a fourth aspect of the present invention, there is provided a sample-and-hold circuit device which comprises an input terminal for receiving an input signal, a first switch means for sampling the input signal, a first potential holding means coupled between one terminal of the first switch means and a terminal of reference potential to hold a holding potential of the input signal, means for adjusting a potential between the other terminal of the first switch means and the reference potential terminal to the potential between the one terminal of the first switch means and the reference potential terminal, means for controlling the first switch means at one time to connect the input terminal and one terminal of the first potential holding means and at a second time to again connect the input terminal and one terminal of the first potential holding means after the adjusting means adjusts the potential between the other terminal of the first switch means and the reference potential terminal.

The sample-and-hold circuit device described immediately above, further comprises a second switch means to supply the potential held in the potential holding means to an output terminal, and the control means to control the first switch means to sample the input potential and to control the second switch means to connect the first switch means to the output terminal during the second time the first switch means is closed.

In another aspect, the sample-and-hold circuit device comprises a third switch means to connect the input terminal to the other terminal of the first switch means, a second potential holding means coupled between the other terminal of the first switch means and the reference potential terminal, means for providing the potential between one terminal of the first switch means and the reference potential terminal, a fourth switch means to connect an output terminal of the providing means to one terminal of the first switch means in order to provide the potential provided by the providing means to the second potential holding means.

This sample-and-hold circuit device is controlled by the control signal generating means. The first switch means and the second switch means are turned to sample the input signal. The third switch means is turned off, after the first switch means is turned off to disconnect from the input signal. Then, the fourth switch means is turned on, and the potential between the other terminal of the first switch means and the reference potential terminal is adjusted substantially equal to the potential between one terminal of the first switch means and the reference potential. The providing means can comprise an operational-amplifier circuit device which functions as a voltage follower circuit, for example.

In another aspect, the control means comprises a third switch connected between the input terminal and the other terminal of the first switch means, a second potential holding means connected between the other terminal of the first switch means and the reference potential terminal which comprises a capacitor having a capacitance larger than a capacitance of a capacitor included in the first potential holding means. This control means controls she first switch means to turn off and the second switch means to turn off at the same time to compensate the potential between the other terminal of the first switch means and the reference potential terminal to the potential between one terminal of the first switch means and the reference potential terminal.

According to this sample-and-hold circuit device, when the first switch, as a sampling switch, is turned on while the second switch, as an input signal breaking switch, is turned on, the input charge of the input signal is accumulated in a first capacitor, as the potential holding means. The first switch is turned off, and a channel charge of a MOS transistor of the first switch, is added to a charge of the input signal held in the first capacitor. In this state, the potential between the other terminal of the first switch and the reference potential terminal, i.e, the potential held in the first capacitor, is the accumulated potential of a voltage of the input signal charge and a voltage of the channel charge of the MOS transistor.

The second switch is turned off, the input terminal is separated from the first switch, an analog input signal of input terminal is disconnected from the potential holding means. Then, the first switch is turned on again, and an error potential caused by the channel charge of the MOS transistor is removed from the potential held in the first capacitor, because the channel charge held in the first capacitor has returned to the first switch to form a channel of the MOS transistor. An error capacitance of the stray capacitance presented between a gate electrode and a drain, or source electrode of the MOS transistor is cancelled by the first switch being turned on again. So, the first switch is set in an on state, in the state the first switch does not produce the channel charge and the error charge caused by the overlap capacitances, and the potential of the input signal held in the first capacitor is transferred to the output terminal.

The invention in its broader aspects is not limited to the specific details and illustrated examples shown and described. Accordingly, it is intended that the present invention cover such modifications and variations provided that they fall within the scope of the appended claims and their equivalents.

What is claimed is:

1. A sample-and-hold circuit device comprising:

an input terminal for receiving an input signal:

first switch means, responsive to a first control signal, for selectively coupling said input terminal and a first internal terminal;

second switch means, responsive to a second control signal, for selectively coupling said first internal terminal and a second internal terminal;

first potential holding means coupled between said second internal node and a reference potential terminal;

control signal generating means to generate said first and second control signal generating means to generate said first and second control signal to close the first and second switch means to sample an input potential of the input signal in said first potential holding means as a holding potential, to generate said second control signal to open the second switch means to hold said holding potential in said first potential holding means, and to generate said first and second control signals to open the first switch means and close the second switch means to obtain said holding potential in said first potential holding means.

2. A sample-and-hold circuit device according to claim 1, wherein said first switch means comprises a MOS transistor having an input coupled to said input terminal, an output coupled to said first internal terminal, and a gate terminal coupled to receive said first control signal, and said second switch means comprising a MOS transistor having an input coupled to said first internal terminal, an output coupled to said second internal terminal, and a gate terminal coupled to receive said second control signal.

3. A sample-and-hold circuit device according to claim 1, further comprising:

an output terminal means;

a third switch means which is turned on or off by a third control signal generated by said control signal generating means for selectively coupling said second internal terminal and said output terminal means.

4. A sample-and-hold circuit device according to claim 3, wherein said control signal generating means further comprises:

means to generate said first, second and third control signal so as to turn the first and second switch means on and to turn the third switch means off when the input potential is sampled in said first potential holding means as the holding potential, to generate said second and third control signals so as to turn the second and third switch means off when said holding potential is held in said first potential holding means, and to generate said first, second and third control signal so as to turn the first switch means off and turn the second and third switch means on when said holding potential is transferred to said output terminal means.

5. A sample-and-hold circuit device according to claim 4, wherein said third switch means further comprises a MOS transistor having an input coupled to said second internal terminal, an output coupled to said output terminal means, and a gate terminal coupled to receive said third control signal.

6. A sample-and-hold circuit device according to claim 1, further comprising a second potential holding means coupled between said first internal terminal and said reference potential terminal.

7. A sample-and-hold circuit device according to claim 6, wherein said first switch means comprises a MOS transistor having an input coupled to said input terminal, an output coupled to said first internal terminal, and a gate terminal coupled to receive said first control signal, and said second switch means comprises a MOS transistor having an input coupled to said first internal terminal, an output coupled to said second internal terminal, and a gate terminal coupled to receive said second control signal.

8. A sample-and-hold circuit device according to claim 6, wherein said first potential holding means comprising a capacitor, and said second potential holding means comprises a capacitor having a capacitance approximately twice a capacitance of said first potential holding means.

9. A sample-and-hold circuit device according to claim 6, wherein said first and second potential holding means each comprise a capacitor with substantially the same capacitance.

10. A sample-and-hold circuit device according to claim 6, further comprising a third switch means turned on or off by a third control signal generated by said control signal generating means for selectively coupling said second internal terminal and an output terminal means.

11. A sample-and-hold circuit device according to claim 10, wherein said control signal generating means further comprises;

means to generate said first, second and third control signals so as to turn the first and second switch means on and to turn the third switch means off when the input potential is sampled in said first potential holding means as the holding potential, to generate said second and third control signals so as to turn the second and third switch means off when said holding potential is held in said first potential holding means, and to generate said first, second and third control signals so as to turn the first switch means off and turn the second and third switch means on when said holding potential is transferred to said output terminal means.

12. A sample-and-hold circuit device according to claim 10, wherein said first potential holding means comprises a capacitor, and said second potential holding means comprises a capacitor having a capacitance approximately twice a capacitance of said first potential holding means.

13. A sample-and-hold circuit device according to claim 10, wherein said first and second potential holding means each comprise a capacitor with substantially the same capacitance.

14. A sample-and-hold circuit device according to claim 6, further comprise:

an output terminal means;

third switch means coupled in series between said second internal terminal and said output terminal means; buffer means coupled between said second internal terminal and said third switch means, said third switch means being turned on or off by said third control signal generated by said control signal generating means for selectively coupling said buffer means and said output terminal means.

15. A sample-and-hold circuit device according to claim 14, wherein said buffer means comprises a voltage follower circuit including an operational amplifier means having a positive input terminal, a negative input terminal and an output terminal, said positive input terminal coupled to said second internal terminal and said negative input terminal coupled to said output terminal of said operational amplifier means.

16. A sample-and-hold circuit device according to claim 14, wherein said control signal generating means further comprises:

means to generate said first, second and third control signals so as to turn the first and second switch means on and to turn the third switch means off when the input potential is sampled in said first potential holding means as the holding potential, to generate said second and third control signals so as to turn the second and third switch means off when said holding potential is held in said first potential holding means, and to generate said first, second and third control signals so as to turn the first switch means off and turn the second and third switch means on when an output potential of said buffer means is transferred to said output terminal means.

17. A sample-and-hold circuit device according to claim 14, further comprising means for selectively providing in said second potential holding means a magnitude of charge substantial equal to a charge held in said first potential holding means.

18. A sample-and-hold circuit device according to claim 17, wherein said providing means comprises a fourth switch means turned on or off by a fourth control signal generated by said control signal generating means for selectively coupling said first internal terminal and an output terminal of said buffer means.

19. A sample-and-hold circuit device according to claim 18, wherein said control signal generating means further comprises:

means to generate said first, second, third and fourth control signals so as to turn the first and second switch means on and to turn the third and fourth switch means off when the input potential is sampled in said first potential holding means as the holding potential, to generate said second, third and fourth control signals so as to turn the second, third and fourth switch means off when said holding potential is held in said first potential holding means, to generate said first, second, third and fourth control signals so as to turn the first, second and third switch means off and to turn the fourth switch means on when an output potential of said buffer means is provided in said second potential holding means to generate said first, second, third and fourth control signals so as to turn the first and fourth switch means off and turn the second and third switch means on when said output potential of said buffer means is transferred to said output terminal means.

20. A sample-and-hold circuit device according to claim 19, wherein said fourth switch means comprises a MOS transistor having an input coupled to said output terminal of said buffer means, an output coupled to said first internal terminal, and a gate terminal coupled to receive said fourth control signal.

21. A sample-and-hold circuit device according to claim 18, wherein said buffer means comprises;

a voltage follower circuit including an operational amplifier means having a positive input terminal, a negative input terminal and an output terminal, said positive input terminal coupled to said second internal terminal through a first source follower circuit and fifth switch means which is turned on or off by a fifth control signal generated by said control signal generating means, said negative input terminal coupled to said output terminal of said operational amplifier means through a second source follower circuit and sixth switch means which is turned on or off by a sixth control signal generated by said control signal generating means.

22. A sample-and-hold circuit device according to claim 21, wherein said control signal generating means further comprises:

means to generate said first, second, third, fourth, fifth and sixth control signals so as to turn the first and second switch means on and to turn the third, fourth, fifth and sixth switch means off when the input potential is sampled in said first potential holding means as the holding potential, to generate said second, third and fourth control signals so as to turn the second, third and fourth switch means off when said holding potential is held in said first potential holding means, to generate said first, second, third, fourth, fifth and sixth control signals so as to turn the first, second and third switch means off and to turn the fourth, fifth and sixth switch means on when said output potential of said buffer means is provided in said second potential holding means, to generate said first, second, third, fourth, fifth and sixth control signals so as to turn the first and fourth switch means off and turn the second, third, fifth and sixth switch means on when an output potential of said buffer means is transferred to said output terminal means.

* * * * *